United States Patent [19]

Banerji et al.

[11] Patent Number: 5,499,756
[45] Date of Patent: Mar. 19, 1996

[54] METHOD OF APPLYING A TACKING AGENT TO A PRINTED CIRCUIT BOARD

[75] Inventors: Kingshuk Banerji, Plantation; Edwin L. Bradley, III, Sunrise; Francisco Da Costa Alves, Boca Raton, all of Fla.

[73] Assignee: Motorola, Inc., Schaumburg, Ill.

[21] Appl. No.: 383,145

[22] Filed: Feb. 3, 1995

[51] Int. Cl.$^6$ ............................... B23K 31/02; H05K 3/34
[52] U.S. Cl. ................... 228/214; 228/223; 228/180.22; 228/175; 427/96; 427/155; 118/505
[58] Field of Search ..................................... 228/118, 175, 228/180.22, 212, 214, 223; 118/213, 505; 427/58, 96, 155; 148/23

[56] References Cited

U.S. PATENT DOCUMENTS

| | | | |
|---|---|---|---|
| 4,946,524 | 8/1990 | Stumpf et al. | 156/358 |
| 5,024,372 | 6/1991 | Altman et al. | 228/248 |
| 5,172,853 | 12/1992 | Maiwald | 228/248 |
| 5,177,134 | 1/1993 | Mullen, III et al. | 524/284 |
| 5,271,548 | 12/1993 | Maiwald | 228/175 |
| 5,315,070 | 5/1994 | Maiwald | 174/250 |
| 5,435,481 | 7/1995 | Da Costa Alves et al. | 228/223 |

*Primary Examiner*—Samuel M. Heinrich
*Attorney, Agent, or Firm*—Dale W. Dorinski

[57] ABSTRACT

A method of applying a tacking agent to a printed circuit board. The printed circuit board (10) has a number of solder pads (12), and each solder pad is preclad with a layer of solder (14) between 0.02 and 0.3 mm thick. A plastic film (16) is temporarily adhered to the printed circuit board by a pressure sensitive adhesive. The plastic film has a number of apertures (22) that correspond to the solder pads, and is positioned so that the apertures in the film expose the solder coated pads. There is a breakaway tab (20) on the plastic film that is used to peel the film from the printed circuit board in a later operation. The film is roller coated with a high viscosity tacking agent (30) so that a layer of the tacking agent is applied to the exposed interconnect pads. The plastic film is then peeled cleanly away from the printed circuit board using the breakaway tab, leaving the tacking agent only on the solder pads. An electronic component (35) can then be placed on the printed circuit board in contact with the coated solder pads. The printed circuit board and the electronic component can then be heated to reflow the clad solder and form a solder joint between the solder pads and the component.

9 Claims, 2 Drawing Sheets

METHOD OF APPLYING A TACKING AGENT TO A PRINTED CIRCUIT BOARD

TECHNICAL FIELD

This invention relates in general to soldering operations, and more particularly to methods of applying materials to a substrate during the soldering operation.

BACKGROUND

The process of soldering electronic circuitry involves placing and soldering leaded and leadless components on a printed circuit board. During the assembly process, components must be maintained in their proper positions prior to and during the soldering operation. In the case of leaded components, leads inserted into holes in the printed circuit board serve to aid in fixturing the component in place during the soldering operation. In leadless component soldering, there exists a need to fixture the components so that they remain in place and do not move about. This is generally accomplished by the use of an adhesive strategically placed underneath or alongside the component. Prior to assembly, solder is applied to the printed circuit board by stenciling or printing solder paste or by cladding the printed circuit board with solder. The adhesive is normally dispensed or deposited onto the printed circuit board, and the components are then placed in the adhesive. The adhesive is cured either thermally or with ultraviolet light. In each of these cases, a solder flux of some sort must be provided in order to facilitate sound metallurgical solder joints. A flux is normally formulated into the solder paste, or applied as a coating over the entire circuit board.

After soldering, flux residues are removed from the circuit board, typically by cleaning the soldered assembly in either an aqueous or organic cleaning solvent. The existence of an adhesive material underneath or adjacent to components provides a hindrance to cleaning and removing all traces of solder flux from beneath components. The standard industry practice to secure components in place is to use a thermosetting adhesive which cannot be removed after soldering. The cleaning operation is an expensive additional step and, in the case of organic solvents, utilizes material such as chlorofluorocarbons which are environmentally hazardous.

The prior art has attempted to utilize conventional soldering fluxes to hold components in place during the soldering operation. U.S. Pat. No. 4,720,324 discloses the use of solder flux coated over the entire surface of the printed circuit board and, while in a tacky state, the components are added. The tackiness or stickiness of the flux is purported to hold the component in place. While it is clear that conventional soldering flux does provide some degree of tackiness, this method does not function adequately. The resulting coating is too thin to act as a sufficient tacking agent and, when small, closely spaced components are soldered, the components tend to be drawn to one another by the surface tension of the flux and do not stay in their selected positions. Flood coating of the printed circuit board cannot be used with small, light components as they tend to swim or move about in the flux. Further, flood coating results in a waste of flux, as only a small portion of the board real estate is consumed by the solder pads. This increases the need for cleaning and the associated costs and hazards. Clearly, there exists a need for a process to provide a high efficiency, temporary fixturing means for components that also provides a fluxing action for the soldering operation. Such a process would be ideally compatible with printed circuit substrates having solid solder deposition (SSD) or clad solder surfaces, would be highly efficient, and would significantly reduce the need for cleaning, thereby aiding the environment.

DETAILED DESCRIPTION OF THE PREFERRED EMBODIMENT

Figure 1:
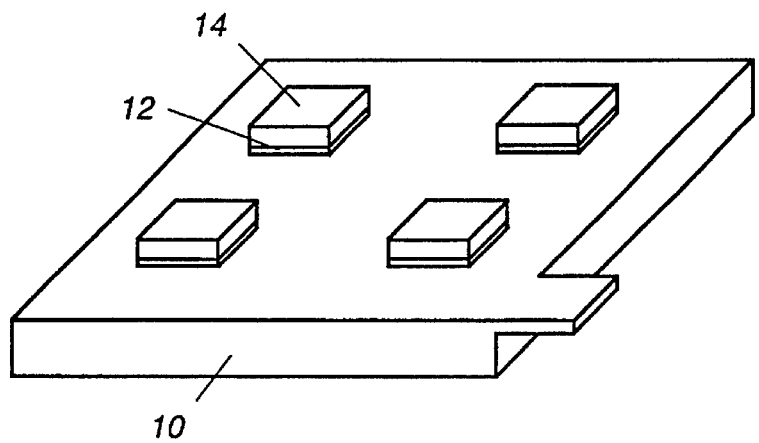
FIGS. 1–5 are perspective views of the various steps in coating a circuit board with a tacking agent in accordance with invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a circuit carrying substrate 10 has a plurality of interconnect pads 12. The circuit carrying substrate can be formed of a wide variety or materials, including, but not limited to, a dielectric material such as single crystal silicon used in the manufacture of semiconductors, ceramic materials, an organic material such as a polyimide or polyester flex circuit, a glass or carbon reinforced epoxy or polyimide substrate, or an injection molded plastic. In the preferred embodiment, a printed circuit board (PCB) such as a glass or carbon reinforced epoxy or polyimide laminate is used. These and other types of PCBs are well known in the industry. In this embodiment, the interconnect pads 12 are typically copper that has been etched to form a circuitry pattern on the face of the PCB. The interconnect pads 12 are also commonly known as solder pads, as they are ultimately used to provide a soldered interconnection to an electronic component. The pads 12 are covered with a layer or coating of solder 14 that is typically from 0.02 to about 0.3 mm thick. This coating 14 is flat and is typically placed on the pads by the manufacturer of the PCB. The preferred coating 14 is referred to variously in the literature as a 'clad' coating or a 'solid solder deposition' (SSD), and is substantially parallel to the surface of the interconnect pads 12. The coating 14 can be applied by a number of methods, including those outlined in U.S. Pat. Nos. 5,172,853; 5,271,548; and 5,315,070.

Figure 2:
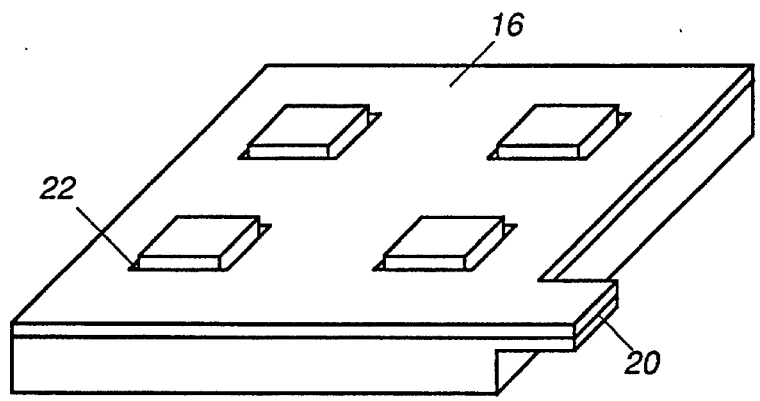

Having now obtained a PCB with a solder clad surface, a removable mask 16 is placed onto the PCB, as shown in FIG. 2. The mask 16 is preferably a plastic film that has been temporarily adhered to the surface of the PCB by a selectively releasing adhesive (not shown) such as a pressure sensitive adhesive. The important point is that the selected adhesive be easily and cleanly releasable from the PCB, leaving no residue on the PCB. The bond between the film and the PCB should not be a strong one, as it will be desirable to easily remove the film in a later step. Other ways of providing a mask are equally applicable, such as using other materials, and other types of adhesives can also be employed, or the adhesive can be eliminated and the film can be heat pressed directly onto the surface of the PCB to effect a temporary bond. The removable mask is typically applied by the PCB manufacturer so that the PCB is ready to use by the assembler. The removable mask 16 contains a breakaway tab 20 that is used later on to remove the mask from the PCB. The breakaway tab 20 can take numerous forms, such as a portion that is not adhered to the PCB, a stiffener on the top of the tab, or, in the preferred embodiment, a portion of the PCB has been specifically created to be easily broken off and carried away with the tab 20 when it is removed. Other examples of breakaway tabs or leader may be found in consumer packaging such as cellophane gum wrappers, detergent boxes, and point-of-purchase coupons. The mask 16 has a number of apertures 22 that correspond to the location and pattern of the solder pads 12 that are etched on the surface of the PCB. The mask is precisely aligned with the etched pattern on the PCB so that the apertures expose or reveal the clad solder pads 12. Normally, there is an aperture corresponding to every solder pad, but in some cases one may wish to cover one or more solder pads for various reasons, and this is accomplished by not providing an aperture for the selected pads. These apertures can be easily formed in the mask by means of die cutting, photolithographic etching, lasers, or many other well known techniques. The thickness of the film mask can vary, but generally it is desirable to have the film approximately the same thickness as the height of the solder coated pads. In the drawing figures, the mask thickness is shown to be slightly less that the height of the pads, and various configurations will be found to be desirable for the individual user. However, in most cases, the mask thickness will be slightly less than, the same as, or slightly greater than the total height of the pads.

Figure 3:
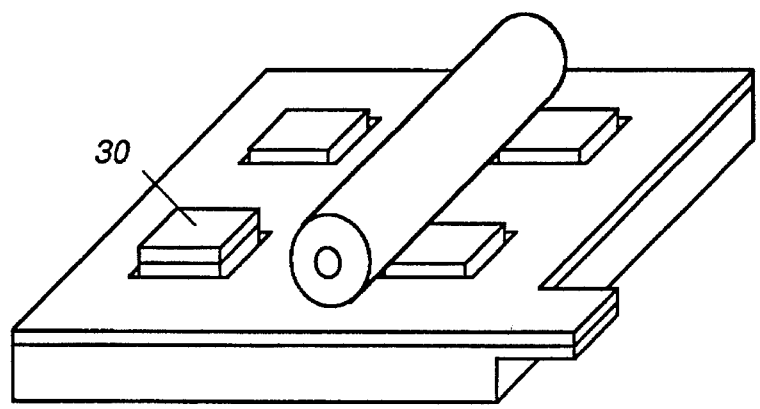

Referring now to FIG. 3, the next step is to coat the solder covered pads 12 with a layer of tacking agent 30. A tacking agent is a material that temporarily adheres electronic components to the PCB and providing fluxing properties for soldering the components to the solder pads. The tacking agent comprises a fluxing agent and a tackifier. Some examples of tacking agents may be found in U.S. Pat. No. 5,177,134 which is incorporated herein by reference. Adhesion and retention of the component is provided by compounds in the tacking agent which produce a fluxing action and volatilize during the soldering process, leaving behind a passive, clean surface. In other formulations, component retention is provided by compounds which partially volatilize during the soldering process leaving a clean, waxy coating in place, eliminating the need for conformal coating. The functions of the tacking agent are accomplished by means of a tackifier and a fluxing agent. The tackifier is typically a medium-to-high viscosity, high-surface tension liquid serving to wet the printed circuit board and the component, and retain the component in position during handling and reflow soldering. The resulting tacking agent is a high viscosity material that has low slump and flow characteristics. The tacking agent is preferably coated directly onto the removable mask 16 by roller coating using a roller made from a porous compliant media that is impregnated with the tacking agent. Alternatively, the tacking agent can be applied by any other mass coating process such as curtain coating, spraying, doctor bladeing, squeegeeing or off-contact printing. Any of these methods is an inexpensive and easily controlled process that provides quick, mass coverage of the pads on the circuit board. Depending on the type of coating process used, some tacking agent may or may not be left on the surface of the removable mask. A desirable result would be to have little or no tacking agent left on the surface of the film, thereby reducing the consumption of tacking agent and making the entire process cleaner and neater. However, the main point is that the mask prevents the tacking agent from being applied all over the unwanted surfaces of the PCB.

The next step is to remove the mask 16 from the PCB. This is accomplished by means of the breakaway tab 20, which is easily grasped by human hands or a robotic gripper.

Figure 4:
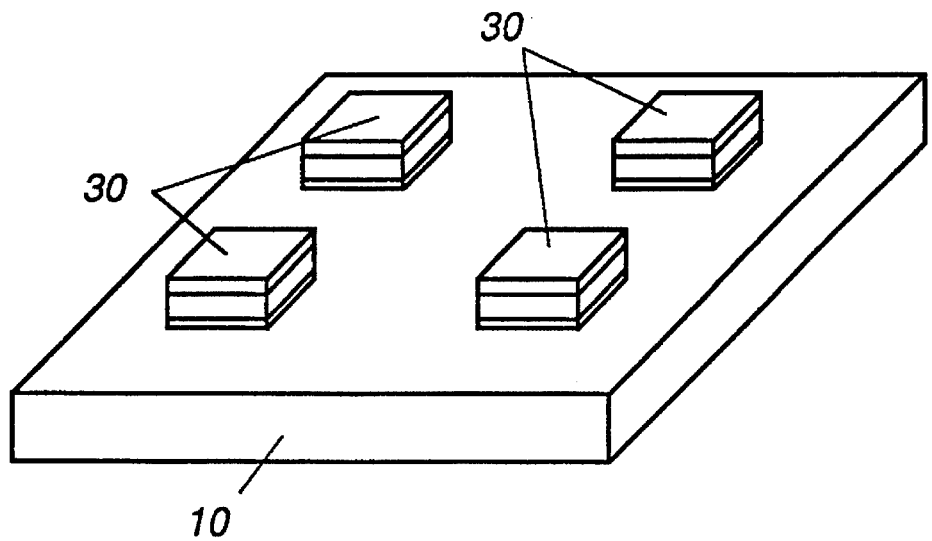

The tab 20 facilitates easy removal of the mask from the PCB. In the preferred embodiment where the mask 16 is a plastic film, it is peeled cleanly away from the PCB, carrying with it any unwanted residues of tacking agent, leaving highly controlled deposits of tacking agent 30 only on the desired solder pads 12, as shown in FIG. 4.

Figure 5:
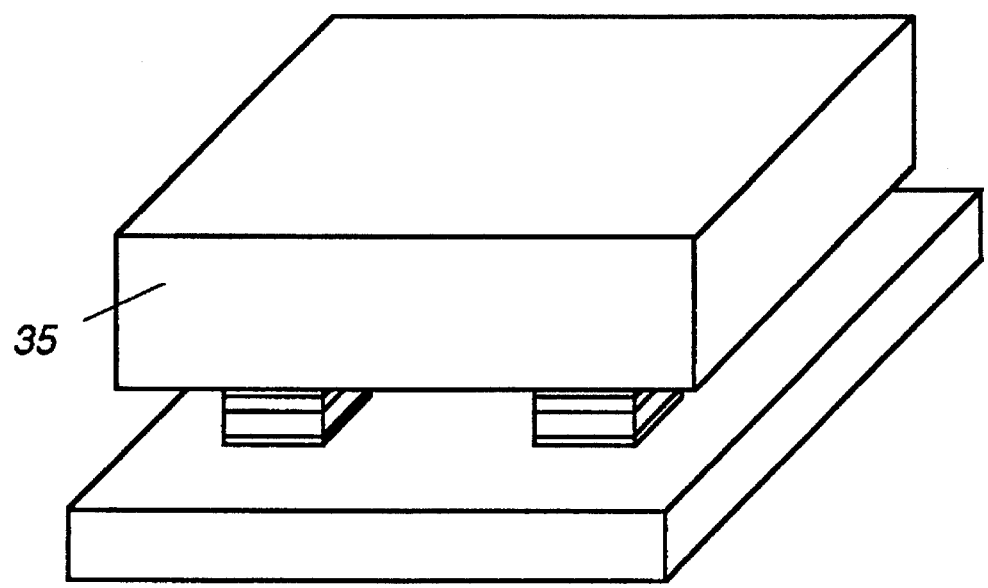

Having now provided a PCB with a tacking agent selectively applied on the solder clad interconnect pads, one may now proceed to use the PCB in a solder assembly process, as shown in FIG. 5. This is typically performed by placing the electronic components 35 on the PCB so that the solderable portions of the components are aligned with the solder pads. After component placement, the assembly is heated to reflow the clad solder, and the flux in the tacking agent provides the necessary fluxing and cleaning actions. It should now be clear to the reader that the instant invention provides a new and novel method of soldering that eliminates the need for screen printing solder paste, the messy operations of fluxing, and the undesirable and costly operations of cleaning. In addition, it provides an inexpensive and fast way of coating the solder pads with the tacking agent.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of applying a tacking agent to a printed circuit board, comprising the steps off providing a printed circuit board having;
    a plurality of interconnect pads on a first face thereof, each interconnect pad having a coating of solder between 0.02 and 0.3 mm thick;
    a plastic film having a plurality of apertures corresponding to the plurality of interconnect pads, the plastic film temporarily adhered to the first face of the printed circuit board by a selectively releasing adhesive so that the apertures in the plastic film reveal the solder coated interconnect pads; and
    a breakaway tab on the plastic film;

roller coating the plastic film with high viscosity tacking agent so that a layer of the tacking agent is applied to the revealed interconnect pads; and peeling the roller coated plastic film from the printed circuit board by means of the breakaway tab;

placing an electronic component on the printed circuit board so that solderable pads on the component are aligned with the coated interconnect pads; and heating the printed circuit board and the electronic component in a manner sufficient to form a solder joint between the interconnect pads and the solderable.

2. The method as described in claim 1, wherein the plastic film is substantially free of the tacking agent after the step of roller coating is completed.

3. A method of applying a tacking agent to a circuit carrying substrate, comprising the steps of:

providing a circuit carrying substrate having;
    a plurality of interconnect pads on a first face thereof, each interconnect pad having a coating of solder;
    a film mask temporarily adhered to the first face of the substrate so that apertures in the film mask reveal the interconnect pads; and
    a breakaway tab on the film mask;

coating the film mask and the revealed interconnect pads with a layer of tacking agent; and removing the coated film mask from the circuit carrying substrate by means of the breakaway tab.

4. The method as described in claim 3, further comprising a final step of placing an electronic component on the circuit carrying substrate so that solderable pads on the component are aligned with the coated interconnect pads.

5. The method as described in claim 4, further comprising a final step of heating the circuit carrying substrate and the electronic component in a manner sufficient to form a solder joint between the interconnect pads and the solderable portions.

6. The method as described in claim 3, wherein the film mask is temporarily adhered to the first face of the substrate by means of a releasable adhesive.

7. The method as described in claim 3, wherein the step of providing a circuit carrying substrate comprises providing a substantially flat layer of solder between 0.02 and 0.3 mm thick on each of the interconnect pads.

8. The method as described in claim 3, wherein the step of coating the film mask and the revealed interconnect pads comprises coating by means of a roller, a curtain coater, a spray gun, a doctor blade, a squeegee or an off-contact printer.

9. The method as described in claim 3, wherein the step of removing comprises peeling.

* * * * *